(12) United States Patent
Jung et al.

(10) Patent No.: US 9,154,117 B2
(45) Date of Patent: Oct. 6, 2015

(54) PULSE GENERATION IN DUAL SUPPLY SYSTEMS

(71) Applicant: QUALCOMM Incorporated, San Diego, CA (US)

(72) Inventors: Changho Jung, San Diego, CA (US); Nishith Desai, San Diego, CA (US); Rakesh Vattikonda, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/787,530

(22) Filed: Mar. 6, 2013

(65) Prior Publication Data

US 2014/0253201 A1    Sep. 11, 2014

(51) Int. Cl.
*H03K 3/00* (2006.01)
*H03K 3/356* (2006.01)

(52) U.S. Cl.
CPC ............... *H03K 3/356104* (2013.01)

(58) Field of Classification Search
CPC ............ H03L 5/00; H03K 19/018521; H03K 19/017509; H03K 17/10
USPC ....................... 327/333; 326/80, 81
See application file for complete search history.

(56) References Cited

U.S. PATENT DOCUMENTS

| | | | |
|---|---|---|---|
| 4,080,539 A * | 3/1978 | Stewart | 326/81 |
| 6,043,698 A * | 3/2000 | Hill | 327/333 |
| 6,366,127 B1 * | 4/2002 | Friedman et al. | 326/83 |
| 6,535,019 B2 * | 3/2003 | De Santis | 326/83 |
| 7,782,093 B2 | 8/2010 | Dray | |
| 7,834,482 B2 | 11/2010 | Fagg | |
| 7,852,119 B1 * | 12/2010 | Kojima | 326/81 |
| 7,864,625 B2 | 1/2011 | Carpenter et al. | |
| 8,493,125 B2 * | 7/2013 | Kikuchi | 327/333 |
| 8,575,987 B2 * | 11/2013 | Kikuchi | 327/333 |
| 2005/0237084 A1 * | 10/2005 | Chauhan et al. | 326/81 |
| 2007/0279092 A1 * | 12/2007 | Wood et al. | 326/81 |
| 2009/0027082 A1 * | 1/2009 | Kuge | 326/63 |
| 2011/0109354 A1 | 5/2011 | Feng et al. | |
| 2011/0140750 A1 * | 6/2011 | Kojima | 327/198 |
| 2012/0169391 A1 | 7/2012 | Sofer et al. | |
| 2013/0128655 A1 * | 5/2013 | Cheng et al. | 365/154 |

* cited by examiner

*Primary Examiner* — Ryan Jager
(74) *Attorney, Agent, or Firm* — Arent Fox LLP

(57) ABSTRACT

Various apparatuses and methods are disclosed. The system describes a pulse generator comprising a first stage configured to be powered by a first voltage; and a second stage configured to be powered by a second voltage different from the first voltage, wherein the second stage is further configured to generate a pulse in response to an input to the first stage comprising a trigger and feedback from the second stage.

23 Claims, 4 Drawing Sheets

PULSE GENERATION IN DUAL SUPPLY SYSTEMS

BACKGROUND

1. Field

The present disclosure relates generally to electronic circuits, and more particularly, to pulse generation in dual supply systems.

2. Background

With the ever increasing demand for more processing capability in mobile devices, low power consumption has become a key design requirement. Various techniques are currently employed to reduce power consumption in such devices. One such technique involves reducing the operating voltage of certain circuits operating on a chip. As a result, different circuits on the chip operate at different voltages. Level shifters are used to convert one voltage level to another voltage level. Level shifters allow a signal to pass from one voltage domain to another voltage domain.

A common circuit used today in dual voltage systems is a one-shot pulse generator. A pulse is generated in a first voltage domain by the one-shot and then level shifted to a second voltage domain. The pulse is generated by gating a trigger with a delayed version of the trigger. The pulse-width is defined by the time between the trigger and the delayed trigger. However, the delay circuit may not track well with process, voltage and temperature (PVT) variations. The pulse width can be very narrow under extreme PVT conditions. This can cause a functional failure if the level-shifted pulse fails to switch from rail-to-rail. The only way to recover is by tuning the delay circuit. The can cost real estate and add timing complexities

SUMMARY

One aspect of a pulse generator includes a first stage configured to be powered by a first voltage, and a second stage configured to be powered by a second voltage different from the first voltage. The second stage is further configured to generate a pulse in response to an input to the first stage comprising a trigger and feedback from the second stage.

One aspect of a method includes generating a pulse from a pulse generator having a first stage powered by a first voltage and a second stage powered by a second voltage different from the first voltage. The method includes generating a pulse in response to an input to the first stage comprising a trigger and feedback from the second stage.

Another aspect of a pulse generator includes pulse generating means for generating a pulse and pre-pulse generating means for generating a pre-pulse from an input comprising a trigger and feedback from the pulse generating means. The pulse generating means is configured to generate the pulse from the pre-pulse. The pre-pulse generating means is configured to be powered by a first voltage, and the pulse generating means is configured to be powered by a second voltage different from the first voltage.

It is understood that other aspects of apparatuses and methods will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses and methods will now be presented in the detailed description by way of example, and not by way of limitation, with reference to the accompanying drawings, wherein.

DETAILED DESCRIPTION

Figure 1:
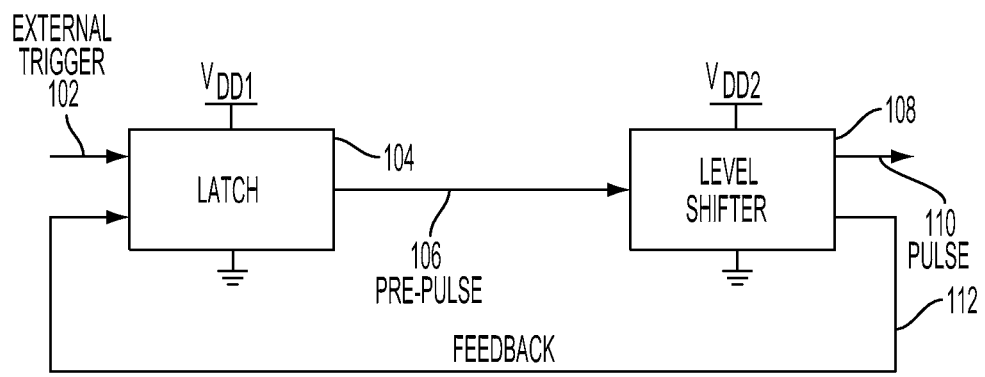
FIG. 1 is a functional block diagram illustrating an example of a pulse generator with feedback.

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure and/or functionality in addition to or instead of other aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the drawings and in the following description. The detailed description and drawings are merely illustrative of the disclosure rather than limiting, the scope of the disclosure being defined by the appended claims and equivalents thereof.

The various circuits described throughout this disclosure may be implemented in various forms of hardware. By way of example, any of these circuits, either alone or in combination, may be implemented as an integrated circuit, part of an integrated circuit, discrete hardware components, or any other suitable implementation designed to perform the functions described herein. The integrated circuit may be an end product, such as a microprocessor, a digital signal processor (DSP), an application specific integrated circuit (ASIC), programmable logic, memory, or any other suitable integrated circuit. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), a laptop computer, a desktop computer (PC), a computer peripheral device, a multimedia device, a video device, an audio device, a global positioning system (GPS), a wireless sensor, or any other suitable device.

FIG. 1 is a functional block diagram illustrating an example of a pulse generator with feedback. The pulse generator 100 is shown with two stages. The first stage may be a latch 104 and the second stage may be a level shifter 108. The latch 104 may be powered by a first voltage source $V_{DD1}$ and the level shifter 108 may be powered by a second voltage source $V_{DD2}$. The first voltage source $V_{DD1}$ may be greater than the second voltage source $V_{DD2}$, or alternatively, second voltage source $V_{DD2}$ may be greater than the first voltage source $V_{DD1}$. In at least one embodiment, the pulse generator 100 may be configured to operate with voltage scaling for dynamic power reduction, wherein the first and second voltage sources $V_{DD1}$ and $V_{DD2}$ may scale independently of each other according to the workload requirements of the system. By way of example, the first voltage source $V_{DD1}$ may scale below the second voltage source $V_{DD2}$ if the system powered by the first voltage source $V_{DD1}$ has lower activity and needs to go into a low power state, and vice versa.

The input to the latch 104 includes an external trigger 102 and feedback 112 from the level shifter 108. In at least one embodiment, the external trigger 102 may be a clock or other periodic signal. As will be described in greater detail later, the latch 104 generates a pre-pulse 106 in the $V_{DD1}$ domain in response to the input. The level shifter 108 generates a pulse 110 in the $V_{DD2}$ domain in response to the pre-pulse 106.

Figure 2:
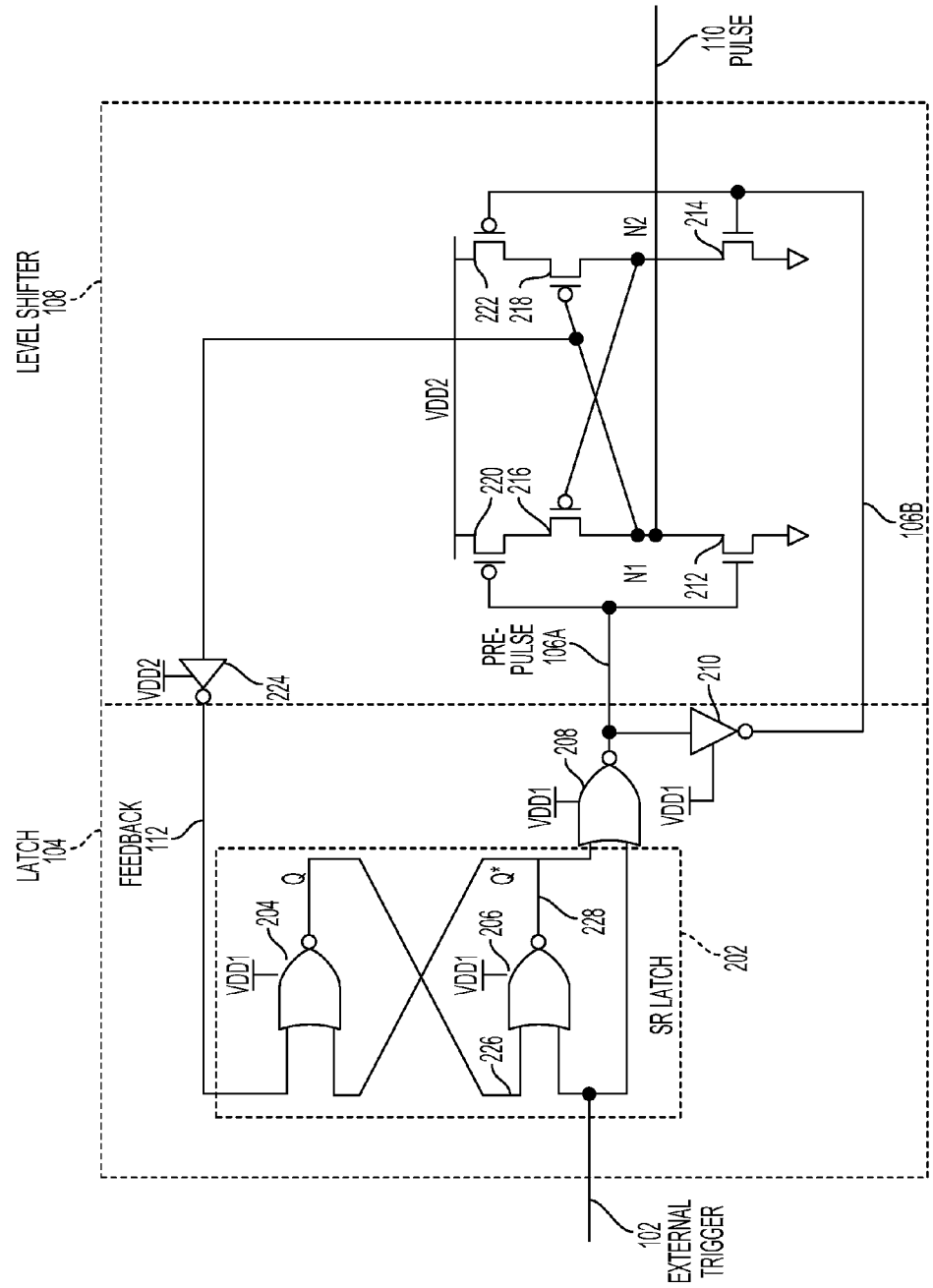
FIG. 2 is a schematic representation illustrating an example of a pulse generator with feedback.

FIG. 2 is a schematic representation illustrating an example of a pulse generator with feedback. The operation of the pulse generator will be described in connection with two logic states represented by two voltage bands: one near the supply voltage and one near the supply voltage return, typically ground. The term "high" may be used to reference the band near the supply voltage. By way of example, the term "high" used to describe the operation of a circuit in the $V_{DD1}$ domain means that the voltage is in a band near the supply voltage $V_{DD1}$. The same applies for the $V_{DD2}$ domain. The term "low" may be used to reference the band near the supply voltage return or ground.

Returning to FIG. 2, the pulse generator 100 is shown with a latch 104 and a level shifter 108. As described earlier, the latch 104 provides a means for generating a pre-pulse 106 from an input comprising an external trigger 102 and feedback 112 from the level shifter 108, and the level shifter 108 provides a means for generating a pulse 110 from the pre-pulse 106.

In at least one embodiment, the latch 104 is configured as an SR latch with a gated output. In this embodiment, the SR latch 202 is constructed from a pair of cross-coupled NOR gates 204, 206. Specifically, the output of the NOR gate 204 is coupled to a first input of the NOR gate 206 and the output of the NOR gate 206 is coupled to a first input of the NOR gate 204. An external trigger is coupled to a second input of the NOR gate 206 and feedback from the level shifter 108 is coupled to a second input of the NOR gate 204. The output from the NOR gate 204 is the Q output of the SR latch 202 and the output from the NOR gate 206 is the complimentary Q* output of the SR latch 202. In operation, the external trigger 102 is used to set the SR latch 202 (i.e., force the Q output high) and the feedback 112 from the level shifter 108 is used to reset the SR latch 202 (i.e., force the Q output low). In at least one embodiment, the sizing of the NOR gate 204 may be skewed for strong NMOS and weak PMOS transistors so that the NOR gate 204 acts as another level shifter between the feedback 112 in the $V_{DD2}$ domain and the Q output of the NOR gate 204 in the $V_{DD1}$ domain.

With both the external trigger 102 and the feedback 112 from the level shifter 108 low, the cross-coupling between the two NOR gates 204, 206 maintains the state of the SR latch 202. The SR latch 202 is set by driving the external trigger 102 high with the feedback 112 from the level shifter 108 low. The SR latch 202 remains set when the external trigger returns to low. Similarly, the SR latch 202 is reset by driving the feedback 112 from the level shifter 108 high with the external trigger 102 low. The SR latch 202 remains reset when the feedback 112 from the level shifter 108 returns to low.

In the embodiment shown, the complimentary output Q* from the SR latch 202 is gated with external trigger 102. Specifically, the Q* output from the SR latch 202 is coupled to a first input of a NOR gate 208 and the external trigger 102 is coupled to a second input of the NOR gate 208. The output of the NOR gate 208 is the pre-pulse 106A that is provided to the level shifter 108. The pre-pulse 106 is also provided to an inverter 210. The inverter 210 provides an inverted pre-pulse 106B to the level shifter 108. As will be explained in greater detail later, the level shifter 108 generates a pulse 110 in a different voltage domain from the pre-pulse 106A and the inverted pre-pulse 106B.

In operation, the rising edge of the external trigger 102 is used to set the SR latch 202. The Q* output from the SR latch 202 is forced low when the SR latch 202 is set. With the Q* output from the SR latch 202 low, the NOR gate 208 is enabled. Specifically, the NOR gate 208 acts as an inverter for the external trigger 102 when the Q* output from the SR latch 202 is low, thereby setting the pre-pulse 106 high with the falling edge of the external trigger 102. The level shifter 108 generates a pulse 110 in the $V_{DD2}$ domain from the pre-pulse 106A (and the inverted pre-pulse 106B) generated in the $V_{DD1}$ domain. The transition of the leading edge of the pulse 110 forces the feedback 112 provided to the SR latch 104 high. The feedback resets the SR latch 202 and forces the Q* output high. The Q* output, in turn, disables the NOR gate 208, which forces the pre-pulse 106 low regardless of the state of the external trigger 102.

The level shifter 108 may take on various forms depending upon the particular application and design requirements. In at least one embodiment, the level shifter 108 may be implemented as a CMOS level shifter. The CMOS level shifter includes a pair of NMOS transistors 212, 214 with their sources coupled to ground, a pair of PMOS transistors 220, 222 with their sources coupled to $V_{DD2}$, and a pair of cross-coupled PMOS transistors 216, 218. The PMOS transistor 216 has a source coupled to the drain of the PMOS transistor 220 and a drain coupled at a node N1 to the drain of the NMOS transistor 212. The pulse 110 generated by the level shifter 108 is output from the node N1 and provides a voltage swing between $V_{DD2}$ and ground. The PMOS transistor 218 has a source coupled to the drain of the PMOS transistor 222 and a drain coupled at a node N2 to the drain of the NMOS transistor 214. The gate of the PMOS transistor 216 is coupled to the node N2 and the gate of the PMOS transistor 218 is coupled to the node N1.

The level shifter is operated in the $V_{DD2}$ domain and does not have access to the $V_{DD1}$ domain other than the pre-pulse be converted. The pre-pulse 106A is coupled to the NMOS transistor 212 and the inverted pre-pulse 106B is coupled to the NMOS transistor 214.

When the pulse generator 100 is inactive, the pre-pulse 106A is low and the inverted pre-pulse 106B is high. In this state, the pre-pulse 106A turns on the PMOS transistor 216 and turns off the NMOS transistor 212. The inverted pre-pulse 106B turns off the PMOS transistor 222 and turns on the NMOS transistor 214. The node N2 is pulled down to ground through the NMOS transistor 214, which turns on the PMOS transistor 216. The pulse 110 output from the level shifter 108 at node N1 is pulled up to $V_{DD2}$ through the PMOS transistors 216, 220, which turns off the PMOS transistor 218. The pulse 110 is also provided to an inverter 224 in the level shifter 108. The inverter 224 is used to provide the inverted pulse as feedback 112 to the latch 104.

As discussed earlier in connection with the latch 104, the pre-pulse 106A is forced high with the falling edge of the external trigger 102. With the pre-pulse 106A high, the PMOS transistor 220 is turned off and the NMOS transistor 212 is turned on. The inverted pre-pulse 106B turns on the PMOS transistor 222 and turns off the NMOS transistor 214. The pulse 110 output from the level shifter 108 at the node N1 is pulled down to ground through the NMOS transistor 212, which turns on the PMOS transistor 218. The node N2 is then pulled up to $V_{DD2}$, through the PMOS transistors 218, 222, which turns off the PMOS transistor 216. The inverted pulse, which is high, is provided by the inverter 224 to the latch 104 as feedback 112 to reset the SR latch 202 and force the pre-pulse 106A low. This ensures that the pre-pulse 106 remains high until after the pulse 110 generated by the level shifter 108 has fully transitioned from $V_{DD2}$ to ground.

Once the pre-pulse 106A is forced low by the feedback 112, the level shifter is forced back into its inactive state with the PMOS transistor 220 turned on and the NMOS transistor 212 turned off by the pre-pulse 106A, and the PMOS transistor 222 turned off and the NMOS transistor 214 turned on by the inverted pre-pulse 106B. The node N2 is pulled down to ground through the NMOS transistor 214, which turns on the PMOS transistor 216. The pulse 110 output from the level shifter 108 at node N1 is pulled back up to $V_{DD2}$ through the PMOS transistors 216, 220, which turns off the PMOS transistor 218. The inverted pulse is forced low and provided to the latch as feedback 112.

The inverter 224 provides both a means for inverting the pulse 110 to provide feedback to the latch 104 and a means for delaying the feedback. Additional delay elements (not shown) may be added in the feedback path to increase the delay, and thereby increase the width of the pulse 110. The delay elements may be a series of inverters or other devices.

Figure 3:
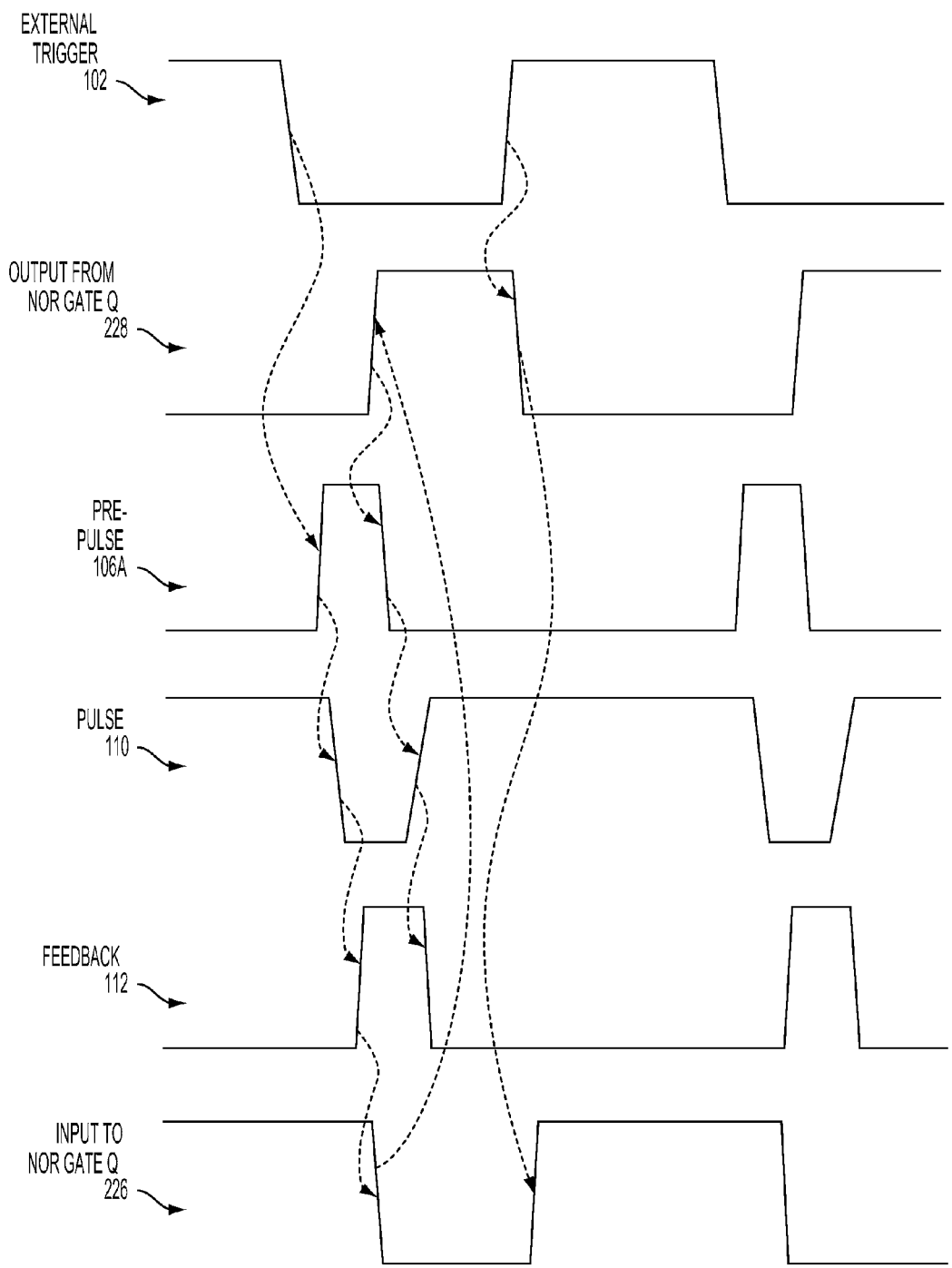
FIG. 3 is a timing diagram illustrating an example of the operation of a pulse generator with feedback.

FIG. 3 is a timing diagram illustrating an example of the operation of a pulse generator. The pre-pulse 106A is generated by the latch 104 in response to the falling edge of the external trigger 102. The pre-pulse 106A is output from the latch 104 to the level shifter 108 to generate the pulse 110. In this example, the pulse 110 is triggered by the rising edge of the pre-pulse 106A. The inverted pulse is provided to the latch as feedback 112. Specifically, once the pulse 110 fully transitions from $V_{DD2}$ to ground, the feedback signal 112 is forced high. As described earlier, the feedback to the latch 104 may be delayed by a series of delay elements in the feedback path to increase the width of the pulse 110. The feedback is used to reset the SR latch by forcing the Q output low, which in turn forces the complementary Q* output from the SR latch high. The rising edge of the Q* output forces the pre-pulse 106A back to a low state, which in turn forces the pulse 110 back to a high state. The feedback signal 112 is forced low with the rising edge of the pulse 110. The SR latch is then set with the next rising edge of external trigger 102, which forces the Q output high and the Q* output low.

Figure 4:
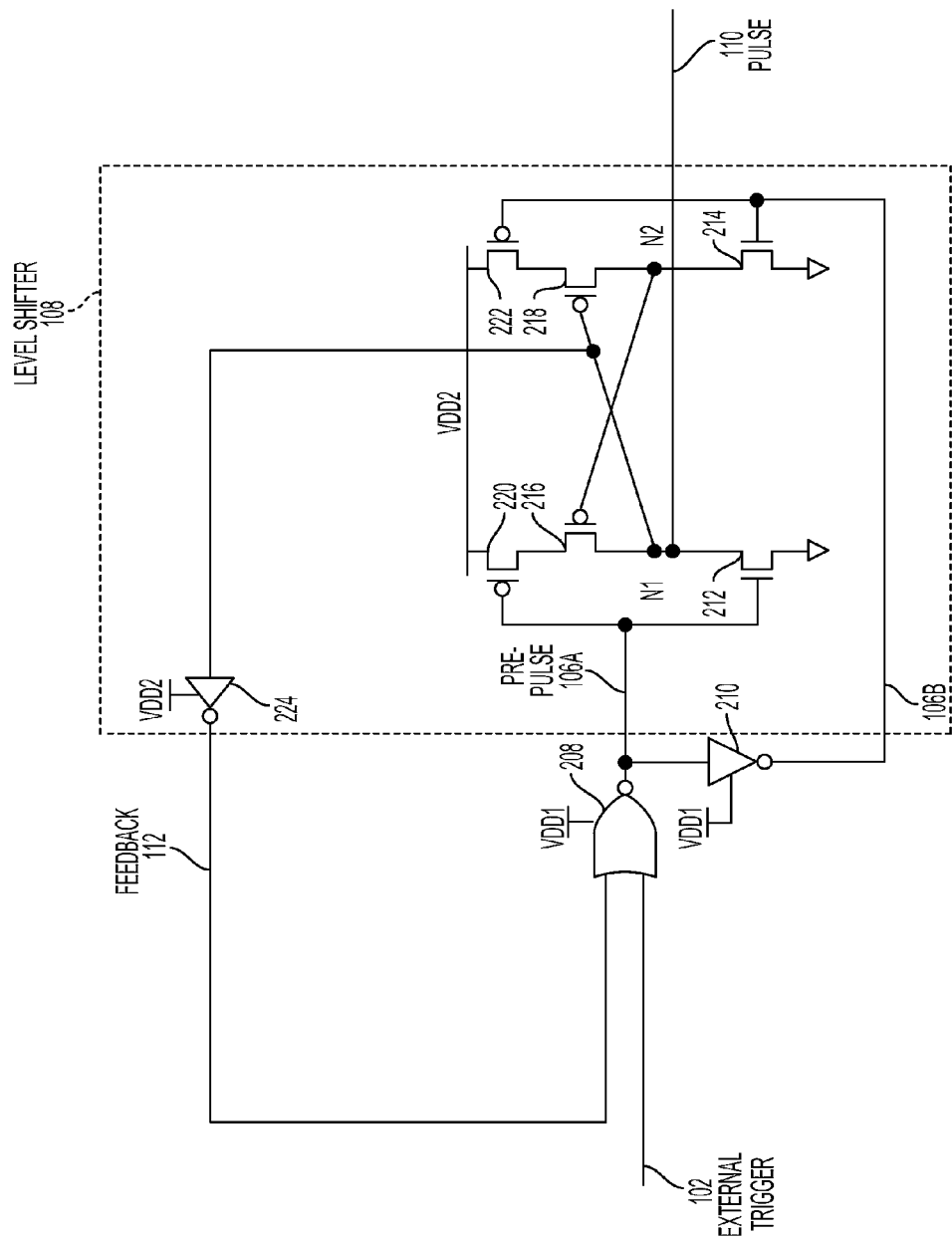
FIG. 4 is a schematic representation illustrating another example of a pulse generator with feedback.

The SR latch may be used when the pulse is passed from a high voltage domain to a low voltage domain. However, when the pulse is being passed from a low voltage domain to a high voltage domain, the SR latch may be omitted. FIG. 4 is a schematic representation illustrating an example a pulse generator having this embodiment. The pulse generator 100 is shown with two stages. The first stage may be a NOR gate 208 and inverter 210 and the second stage may be a level shifter 108. The level shifter 108 may be the same as described earlier and is reproduced here in FIG. 4. Alternatively, the level shifter 108 may take on another form. In any event, the pulse 110 is inverted by the inverter 224 and provided directly to the first input of the NOR gate 208 as feedback 112. The external trigger 102 is provided to the second input of the NOR gate 208. The output from the NOR gate 208 is coupled to the level shifter 108 as the pre-pulse 106A. The output is also provided to the inverter 210 which is used to provide an inverted pre-pulse 106B to the level shifter 108.

When the pulse generator 100 is inactive, the pulse 110 output from the level shifter 108 is high and the feedback 112 provided to the NOR gate 208 is low. The low feedback signal 112 enables the NOR gate 208 to act as an inverter for the external trigger 102. When the external trigger 102 transitions from a high state to a low state, the pre-pulse 106A output from the NOR gate 208 is forced high and the inverted pre-pulse 106B is forced low. As explained in greater detail earlier, this forces the pulse 110 at the output of the level shifter to transition from $V_{DD2}$ to ground. Once the pulse 110 transitions, the feedback provided to the NOR gate 208 is forced high. The high feedback signal disables the NOR gate 208 forcing the pre-pulse 106 output low regardless of the state of the external trigger 102. When the pre-pulse 106 transitions low, the pulse 110 output from the level shifter 108 is forced back into the high state.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f), unless the element is expressly recited using the phrase "means for" or, in the case of a method claim, the element is recited using the phrase "step for."

What is claimed is:

1. A pulse generator, comprising:
   a first stage configured to be powered by a first voltage; and
   a second stage configured to be powered by a second voltage different from the first voltage, wherein the second stage is further configured to generate a pulse in response to an input to the first stage comprising a trigger and feedback from the second stage, wherein the pulse transitions from a first state to a second state in response to an edge of the trigger and then transitions from the second state to the first state in response to the same edge of the trigger before a subsequent edge of the trigger occurs.

2. The pulse generator of claim 1 wherein the second stage comprises an inverter configured to invert the pulse generated by the second stage, and wherein the feedback from the second stage to the input of the first stage comprises the inverted pulse.

3. The pulse generator of claim 1 wherein the second stage comprises a delay element configured to delay the feedback from the second stage to the first stage, wherein the width of the pulse generated by the second stage is a function of the delay.

4. The pulse generator of claim 1 wherein the first stage is further configured to generate a pre-pulse output from the trigger and the feedback, and wherein the second stage comprises a level shifter configured to level shift the pre-pulse to generate the pulse.

5. The pulse generator of claim 4 wherein the pre-pulse generated by the first stage comprises a leading edge responsive to the trigger and a trailing edge responsive to the feedback from the second stage.

6. The pulse generator of claim 4 wherein the first stage comprises a NOR gate configured to gate the trigger and the feedback to generate the pre-pulse.

7. The pulse generator of claim 1, wherein the pulse has a magnitude substantially equal to the second voltage, and wherein the first stage is configured to generate a pre-pulse as an input to the second stage, and the pre-pulse has a magnitude substantially equal to the first voltage.

8. The pulse generator of claim 1, wherein the first stage comprises a latch configured to be set by the trigger and reset by the feedback.

9. A method of generating a pulse from a pulse generator comprising:
a first stage configured to be powered by a first voltage and a second stage configured to be powered by a second voltage different from the first voltage, the method comprising:
generating a pulse in response to an input to the first stage comprising a trigger and feedback from the second stage, wherein the pulse transitions from a first state to a second state in response to an edge of the trigger and then transitions from the second state to the first state in response to the same edge of the trigger before a subsequent edge of the trigger occurs.

10. The method of claim 9 wherein the generating of the pulse comprises inverting the pulse generated by the second stage, wherein the feedback from the second stage to the input of the first stage comprises the inverted pulse.

11. The method of claim 9 wherein the generating of the pulse comprises delaying the feedback from the second stage to the first stage, wherein the width of the pulse generated by the second stage is a function of the delay.

12. The method of claim 9 wherein the generating of the pulse comprises generating a pre-pulse from the trigger and the feedback, and level shifting the pre-pulse to generate the pulse.

13. The method of claim 12 wherein the pre-pulse generated by the first stage comprises a leading edge responsive to the trigger and a trailing edge responsive to the feedback from the second circuit.

14. The method of claim 12 wherein the generating of the pulse comprises gating the trigger and the feedback with a NOR gate to generate the pre-pulse.

15. A pulse generator, comprising:
pulse generating means for generating a pulse;
pre-pulse generating means for generating a pre-pulse from an input comprising a trigger and feedback from the pulse generating means;
wherein the pulse generating means is configured to generate the pulse from the pre-pulse, and wherein the pulse transitions from a first state to a second state in response to an edge of the trigger and then transitions from the second state to the first state in response to the same edge of the trigger before a subsequent edge of the trigger occurs; and
wherein the pre-pulse generating means is configured to be powered by a first voltage, and the pulse generating means is configured to be powered by a second voltage different from the first voltage.

16. The pulse generator of claim 15 wherein the pulse generating means comprises means for inverting the pulse, and wherein the feedback from the pulse generating means to the input of the pre-pulse generating means comprises the inverted pulse.

17. The pulse generator of claim 16 wherein the pulse generating means comprises means for delaying the feedback from the pulse generating means to the pre-pulse generating means, wherein the width of the pulse generated by the pulse generating means is a function of the delay.

18. The pulse generator of claim 15 wherein the pulse generating means comprises a level shifter configured to level shift the pre-pulse to generate the pulse.

19. The pulse generator of claim 15 wherein the pre-pulse generated by the pre-pulse generating means comprises a leading edge responsive to the trigger and a trailing edge responsive to the feedback from the pulse generating means.

20. The pulse generator of claim 15 wherein the pre-pulse generating means comprises a NOR gate configured to gate the trigger and the feedback to generate the pre-pulse.

21. A pulse generator, comprising:
a first stage configured to be powered by a first voltage; and
a second stage configured to be powered by a second voltage different from the first voltage, wherein the second stage is further configured to generate a pulse in response to an input to the first stage comprising a trigger and feedback from the second stage, wherein the pulse transitions from a first state to a second state and transitions from the second state to the first state in response to an edge of the trigger,
wherein the first stage is further configured to generate a pre-pulse output from the trigger and the feedback,
wherein the second stage comprises a level shifter configured to level shift the pre-pulse to generate the pulse, and
wherein the first stage comprises an SR latch configured to be set by the trigger and reset by the feedback, and a NOR gate configured to gate an output from the SR latch and the trigger to generate the pre-pulse.

22. A method of generating a pulse from a pulse generator comprising:
a first stage configured to be powered by a first voltage and a second stage configured to be powered by a second voltage different from the first voltage, the method comprising:
generating a pulse in response to an input to the first stage comprising a trigger and feedback from the second stage, wherein the pulse transitions from a first state to a second state and transitions from the second state to the first state in response to an edge of the trigger,
wherein the generating of the pulse comprises generating a pre-pulse from the trigger and the feedback, and level shifting the pre-pulse to generate the pulse, and
wherein the generating of the pre-pulse comprises setting an SR latch by the trigger, resetting the SR latch by the feedback, and gating an output from the SR latch and the trigger with a NOR gate to generate the pre-pulse.

23. A pulse generator, comprising:
pulse generating means for generating a pulse;

pre-pulse generating means for generating a pre-pulse from an input comprising a trigger and feedback from the pulse generating means;
wherein the pulse generating means is configured to generate the pulse from the pre-pulse, and wherein the pulse transitions from a first state to a second state and transitions from the second state to the first state in response to an edge of the trigger; and
wherein the pre-pulse generating means is configured to be powered by a first voltage, and the pulse generating means is configured to be powered by a second voltage different from the first voltage, and
wherein the pre-pulse generating means comprises an SR latch configured to be set by the trigger and reset by the feedback, and a NOR gate configured to gate an output from the SR latch and the trigger to generate the pre-pulse.

\* \* \* \* \*